United States Patent
Wong-Lam et al.

(10) Patent No.: US 6,487,514 B1
(45) Date of Patent: Nov. 26, 2002

(54) SYSTEM AND METHOD FOR COMPUTER CONTROLLED INTERACTION WITH INTEGRATED CIRCUITS

(75) Inventors: Ho Wai Wong-Lam, Los Altos, CA (US); Mark Douglas Naley, Santa Clara, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/469,886

(22) Filed: Dec. 22, 1999

(51) Int. Cl.[7] ................................................. G06F 9/06
(52) U.S. Cl. .......................... 702/119; 702/80; 702/91; 702/118; 702/117; 702/123
(58) Field of Search ........................... 702/81, 117, 118, 702/119, 123, 91; 395/183, 309

(56) References Cited

U.S. PATENT DOCUMENTS

| | | | |
|---|---|---|---|
| 4,807,161 A | | 2/1989 | Comfort et al. ............ 364/350 |
| 5,390,129 A | | 2/1995 | Rhodes ....................... 364/480 |
| 5,659,690 A | * | 8/1997 | Stuber et al. ................ 395/309 |
| 5,717,697 A | * | 2/1998 | Yin ............................. 371/21.5 |
| 5,828,674 A | * | 10/1998 | Proskauer ................... 371/22.1 |
| 5,845,234 A | | 12/1998 | Testa et al. .................. 702/119 |
| 5,884,023 A | * | 3/1999 | Swoboda et al. ....... 395/183.06 |
| 5,918,194 A | * | 6/1999 | Banaska et al. .............. 702/91 |
| 5,946,641 A | * | 8/1999 | Morys .......................... 702/91 |
| 6,112,163 A | * | 8/2000 | Oowaki et al. ............. 702/117 |
| 6,157,200 A | * | 12/2000 | Okayasu ..................... 324/753 |

* cited by examiner

Primary Examiner—Marc S. Hoff
Assistant Examiner—Felix Suarez

(57) ABSTRACT

A method and system for programmed interaction with integrated circuits (ICs) are disclosed in various embodiments. The system allows a hard-coded program that is suitable for a family of ICs having certain characteristics in common to be dynamically adapted for use with specific ICs within the family. To test a specific IC within a family, the register characteristics and one or more program operations that are particular to the specific are obtained. During execution, the hard-coded program is adapted to interact with the specific IC using the register characteristics and the one or more program operations of the specific IC.

25 Claims, 6 Drawing Sheets

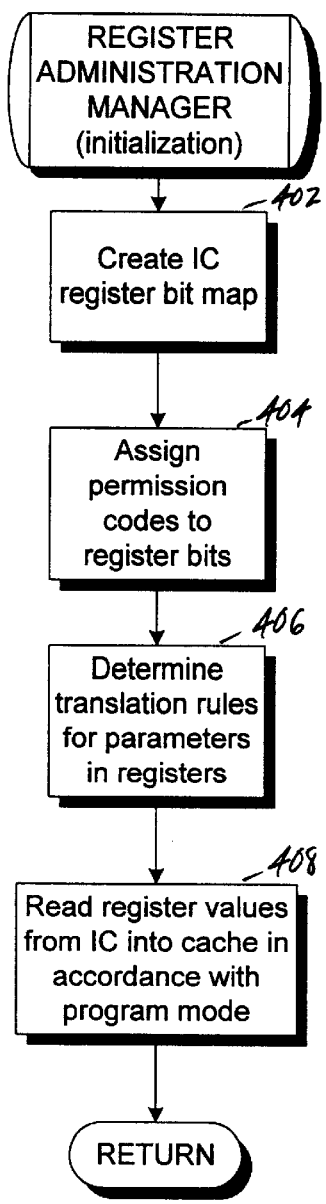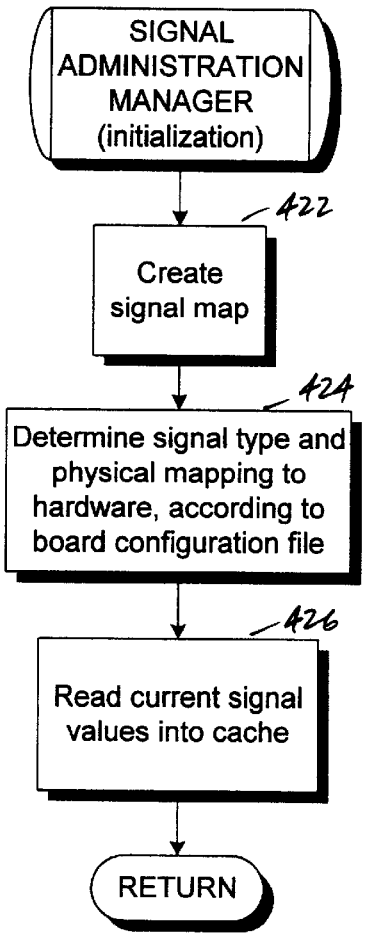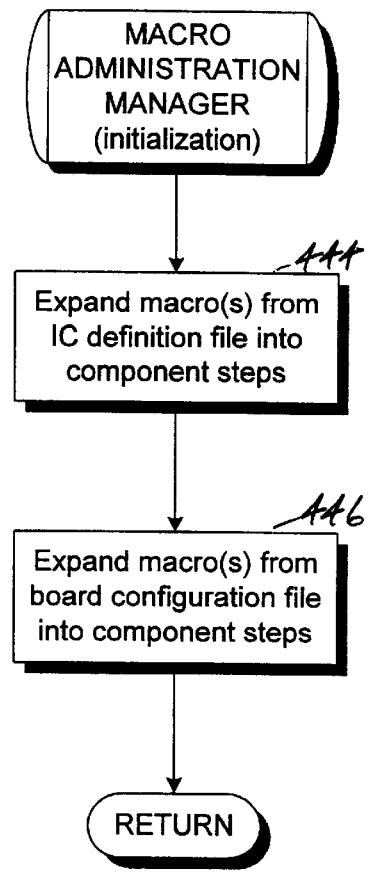
FIG. 7
FIG. 8
FIG. 9

SYSTEM AND METHOD FOR COMPUTER CONTROLLED INTERACTION WITH INTEGRATED CIRCUITS

RELATED PATENT DOCUMENT

The present invention is related to the patent application entitled, "System and Method for Accessing Internal Registers in Integrated Circuits," application Ser. No. 09/469885 (Docket No. 700920), concurrently filed herewith and incorporated herein by reference in its entirety.

FIELD OF THE INVENTION

The present invention generally relates to computer controlled interaction with integrated circuits and more particularly to adapting programs for interacting with different integrated circuits.

BACKGROUND OF THE INVENTION

Testing various operating characteristics of integrated circuits (ICs) is often a repetitive task in which selected characteristics are measured under various conditions. The measured characteristics, include, for example, amplifier gain and bandwidth, rise and fall-times, and switching times. Example conditions for which the measurements are repeated include low and high room temperatures, minimum and maximum supply voltages and various combinations of IC register contents and pin controls.

In many systems, tests are conducted using a computer that is programmed with test software. The computer is coupled to an interface board via a conventional communications channel, and the IC is connected to the interface board. Generally, individual programs are designed to test each different IC. An IC is sometimes testable using different interface boards. Thus, for a single IC there may be many different combinations of set-up procedures and test stimuli. Since testing each IC/board combination is accomplished with a different test program, managing and maintaining many such programs can be cumbersome and error prone. For example, if there are 8 IC parts, each testable with 3 different boards, then there would be 24 programs to maintain. For a change in testing that is required for all IC-board combinations, each of the test programs would have to be changed, resulting in additional expenditure of time and an increased possibility of introducing an error. A method and apparatus that addresses the aforementioned problems, as well as other related problems, is therefore desirable.

SUMMARY OF THE INVENTION

In various embodiments, the invention provides a method and system for programmed interaction with integrated circuits (ICs). The system allows a hard-coded program that is suitable for a family of ICs having certain characteristics in common to be dynamically adapted for use with specific ICs within the family. To test a specific IC within a family, the register characteristics and one or more program operations that are particular to the specific IC are obtained. During execution, the hard-coded program is adapted to interact with the specific IC using the register characteristics and the one or more program operations of the specific IC.

The above summary of the present invention is not intended to describe each disclosed embodiment of the present invention. The figures and detailed description that follow provide additional example embodiments and aspects of the present invention.

BRIEF DESCRIPTION OF THE DRAWINGS

Other aspects and advantages of the invention will become apparent upon review of the Detailed Description and upon reference to the drawings in which:

FIG. 7 is a flowchart illustrating initialization processing performed by the register administration manager;

FIG. 8 is a flowchart illustrating initialization processing performed by the signal administration manager; and FIG. 9 is a flowchart illustrating the initialization processing performed by the macro administration manager.

Figure 1:
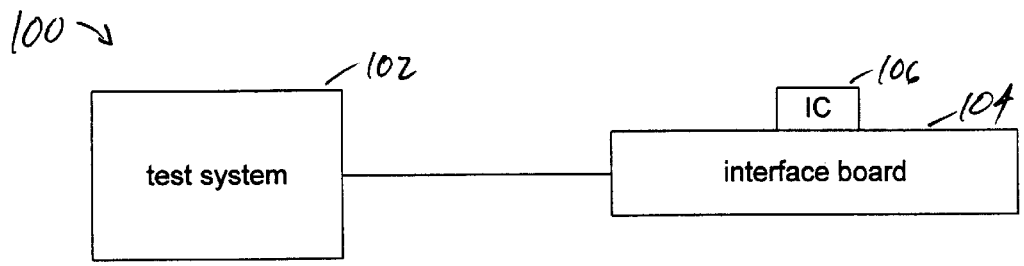
FIG. 1 is a functional block diagram of an example system for testing an IC.

While the invention is susceptible to various modifications and alternative forms, specific embodiments thereof have been shown by way of example in the drawings and will herein be described in detail. It should be understood, however, that the detailed description is not intended to limit the invention to the particular forms disclosed. On the contrary, the intention is to cover all modifications, equivalents, and alternatives falling within the spirit and scope of the invention as defined by the appended claims.

DETAILED DESCRIPTION

The present invention is believed to be applicable to a variety of systems for testing ICs. The invention has been found to be particularly applicable and beneficial for testing various ICs using different interface boards. Testing ICs is but one example area where the need exists for computer program controlled interaction with ICs. Another area is IC configuration, and other applications will be apparent to those skilled in the art. While the present invention is not limited to test environments, an appreciation of the present invention is presented by way of generic test programs that are dynamically adaptable based on specific IC and interface board characteristics.

FIG. 1 is a functional block diagram of an example system for testing an IC. System 100 includes test system 102 coupled to interface board 104. IC 106 is mounted to interface board 104. Test system 102 may be implemented in various forms as known to those skilled in the art. In one implementation, test system 102 is implemented as a microcomputer class computer system. Interface board 104 is coupled to test system 102 via a conventional communication channel, for example, an RS232 bus. IC is conventionally mounted on board 104.

Different ICs will generally contain from a few to tens of registers for programming various IC functionalities. The names and numbers of registers, as well as the sizes and read/write access will vary from IC to IC. The registers are further subdivided into sets of bits, wherein each set has a predetermined name and function, which is referred to as a parameter.

Despite similarities in functions, different ICs sometimes have different pin-outs. Thus, dedicated boards have to be made for different ICs. Even for the same IC, sometimes boards with different external components are used. For example, many IC's use external components for reference purposes. Furthermore, some boards use jumpers for manual pin control, while others control IC pins via computer control.

One embodiment of the invention addresses the challenges presented in attempting to test ICs using various combinations of interface boards by using generic test program(s) in combination with IC definition and board configuration files. Each generic test program is suitable for a set of ICs having related characteristics, for example, a family of preamplifier ICs.

For each particular IC within a set, an IC definition file sets forth IC-specific operations, such as register parameter definitions. Thus, the IC definition files support tailoring a test program to a specific IC, while a generic test sequence as embodied in a test program is suitable for a family of ICs.

The board configuration files provide board specific characteristics for different interface boards. For example, a particular board interface file includes connector pin numbers and signal types (analog, digital, input/output).

Figure 2:
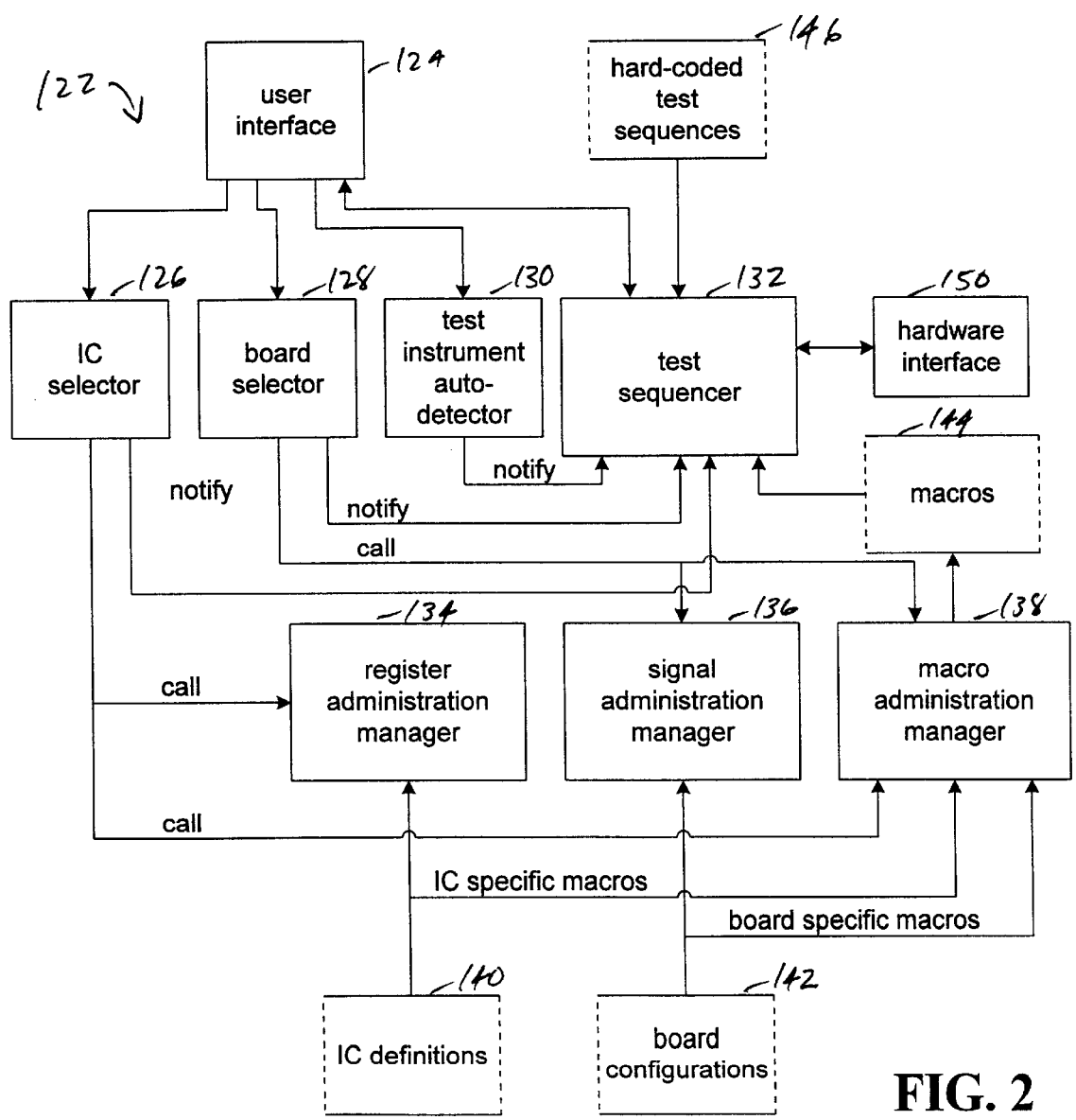
FIG. 2 is a functional block diagram of a system for testing ICs in accordance with one embodiment of the invention.

FIG. 2 is a functional block diagram of a system for testing ICs in accordance with one embodiment of the invention. System 122 includes user interface 124, selector processes 126, 128, and 130, test sequencer 132, and administration managers 134, 136, and 138. In one embodiment, user interface 124 is a graphical user interface that allows the user to select a particular type of IC and board for testing. User interface 124 also displays output test results from the IC under test.

Each of IC selector 126, board selector 128, and test instrument auto-detector 130 is a standalone computer process that is initiated by a user from user interface 124 or done periodically or automatically during start-up. In response to a user selection of an IC, IC selector parses IC definitions 140 that are associated with the selected IC to check for proper syntax. IC selector 126 also calls register administration manager 134 to initialize set-up of system 122 for communicating with the selected IC. Macro administration manager 138 is also called by IC selector 126. Macro administration manager creates a new set of test instructions, shown as macros 144, to be applied to the IC under test based on the IC definitions associated with the selected IC.

In response to a user selection of an interface board, board selector 128 parses board configurations 142 that are associated with the selected board to check for proper syntax. Board selector 128 also calls signal administration manager 136 to initialize setup of system 122 for interfacing with the selected board. Macro administration manager 138 is also called by board selector 128. Macro administration manager 138 creates macros 144 to be applied to the IC under test based on the board configurations associated with the selected board.

Test instrument auto-detector 130 detects instruments that are connected via a communications channel (not shown) to the computer system hosting test system 122. A list identifying the test instruments detected is provided to test sequencer 132, which provides output to user interface 124 to indicate which instruments are selectable for running a test program.

Test sequencer 132 runs hard-coded test sequences 146 in response to user interface 124. Changes to a test configuration, for example, a different IC or interface board, are communicated to test sequencer 132 via "notify" messages from IC and board selectors 126 and 128. In executing a hard-coded test sequence, test sequencer 132 reads macros 144 and adapts the hard-coded test sequence in accordance with the selected IC or board and associated macros.

IC definitions 140 are stored in an IC definition file. In one embodiment, there is a separate IC definition file for each different IC. Each definition file includes information pertaining to the power supply voltages (minimum, maximum, and nominal), register definition data, and macros.

Each register has associated therewith register definition data. The register definition data includes the names of the registers, the hardware addresses of the registers, the numbers of bits/register, and associated read/write accessibility.

In the register definitions, a mnemonic is assigned to a group of bits in a register that together define a function. In the register definition, the position of the group of bits within the register is also specified. Several translation types are provided to deal with translation of bit contents to functions and vice versa.

The "hardware" translation type defines the existence of physical register in an IC. An example register having a hardware translation type is:

08 0 8 reg 0 "Head Select Reg" @ hardware 1 1 1 2 2 2 2 0

The address of the register is 0x08, and the register mnemonic is "reg 0". The parameter spans from bit 0 to bit 7 (having a length of 8 bits), and the label on the user-interface is "Head Select Reg". The sequence of integers that follow the translation type "hardware" specify respective properties of the bits. The recognized bit values are as follows:

0: indicates that neither the IC nor the test system can control the bit's value.
1: indicates that only the IC can write to the bit
2: indicates that only the test system can write to the bit
3: indicates that both the IC and the test system can write to the bit.

The "linear" translation type maps bit contents to real values using a linear equation with a predefined form and vice versa. This translation type is suitable, for example, for a programmable current level that allows 5 bits of programmability in a linear fashion. An example register definition having a linear translation type is:

20 3 5 iw "Write current level Iw (mA)(Rext=10 kOhms)" @ linear 10 1.3
1 2 4 8 16

The address of the iw register 0x20, and the parameter spans from bit 3 to bit 7 (5 bits long). The value of iw is computed as: $10+1.3*(1*d[0]+2*d[1]+4*d[2]+8*d[3]+16*d[4])$, where "d[i]" denotes the value in the parameter bit.

The "tabstring" translation type maps bit contents to strings in a tabular form and vice versa. This translation type is suitable for mapping function descriptions to bits. The following is an example register definition for the parameter name digon within the register at address 0x40.

40 0 1 digon "Internal measurement control" @ tabstring 0 1 &
"Disabled" "Enabled" Within the register, the LSB of the parameter is at bit position 0, and the parameter spans one bit. The string label name "Internal measurement control" is displayed on the user interface. When the bit value of the parameter bit is 0, "Disabled" is displayed, and when the bit value is 1, "Enabled" is displayed.

The "tabfloat" translation type maps contents to floating point values in a tabular form and vice versa. This translation type is suitable for mapping real values to bits where the mapping relationship cannot be easily defined by a linear equation. For example, bit contents 00, 01, 10, and 11 may map to 0.23, −0.14, 1.0, and 4.6, respectively. The following example register definition is for the parameter name tact within the register at address 58:

58 0 3 tact "label name" @ tabfloat 3 2 1 0 & 0.50 0.67 0.9 1.22 Within the register, the LSB of the parameter is 0, and the parameter spans 3 bits. The string "label name" is displayed on the user-interface. A parameter value of 3 ($11_2$) corresponds to the floating point value 0.50, a parameter value of 2 ($10_2$) corresponds to floating point value 0.67, and so on.

The "tabint" translation type maps bit contents to integer value in a tabular form and vice versa. This translation type is similar to tabfloat, with the difference being manipulation of integer values. The following example register definition is for the part id parameter at address 0x30:

30 3 2 part id "Part ID for ICs with same basic design" @tabint 0 1 2 3 & 3 2 1 0

A parameter value of 0 ($00_2$) corresponds to the part ID =3, a parameter value of 1 ($01_2$) corresponds to the part ID=2 and so on.

The macros in IC definitions 140 specify various test actions that are specific to the IC associated with the definitions. For example, the actions include setting a register or signal value to a user-defined value.

In one embodiment, macros are specified in accordance with the following format. A mnemonic of the macro is specified first and is followed by a label of the action, which is enclosed in quotation marks. The label is followed by an "@" character, which indicates that one or more actions follow. The actions are separated by semicolons. The following is an example macro in which register commands are chained.

SetImr "Set Imr" @ pori="Current mode" ;gmr= "SAL";hd i sal=?

Depending on the type of IC, there are various types of actions that can be specified in a macro. For example, in a preamplifier, the actions may include delaying the test program for a specified time, displaying an IC-specific message in a userinterface dialog box, setting a register/signal value to a constant or test program specified value, and getting a register/signal value.

To set a register/signal value to a constant, the user can specify the appropriate constant for the designated translation type. For example, for a register having a translation type of tabstring, as set forth in the following register definition:

48 0 1 mode "mode" @ tabstring 0 1 & "Mode 1" "Mode 2" the following macro could be specified:

SetModel "Set to Mode 1" @ mode="Mode 1"

This macro sets the register mode value to 0, which corresponds to "model". The register could alternatively be set to the value 0 with the action mode=0.

Board configurations 142 are stored in a board configuration file. In one embodiment, there is a separate board configuration file for each different interface board. Each configuration file includes information pertaining to the board related electrical settings (e.g., the MR resistance level), signal definitions, and macros.

Along with the board resistance level, the board settings include reader and writer and head numbers, resistance levels for single and dual stripes (for example, as applied to a preamp), the resistance level across which a differential probe is placed for bias current measurements.

Each signal has associated therewith signal definition data. The signal definition data includes the names of the signals, the physical ports associated with the signals, the types of the signals, and type-dependent information associated with the signals. The port identifiers are those generally recognized as being associated with a particular interface board.

The signal type is one of digital output, digital input, analog output, analog input, manual digital, and manual analog. Other than for the manual signal types, the test program controls the input signals and receives the output signals based on the specified signal type. For the manual signals, when the test program needs to set the signal RWN to "Read", the user is prompted with "Please set the digital signal named "RWN at T16 to Read". The manual signal type specification also allows a user to manually enter a signal value for recording purposes. For example, the user can measure the band-gap voltage using a multimeter and input the measured value which is recorded in signal measurement files.

Signal definitions that are specific to the signal type are as follows. A digital signal can be defined to be inverted or not inverted. That is, when a digital signal that defined to be inverted, the test program inverts the logical state of the signal that was read or is to be applied. For an analog signal, lower and upper limits expected of the signal can be specified. The test program then sets the dynamic range as appropriate for the analog interface board.

The macros in board configurations 142 specify various test actions that are specific to the interface board associated with the definitions. For example, the actions include setting up for current measurements, calibrating heads for measurement, reading signal values, and applying signal values. The format for the signal-related macros is similar to that described above in relation to the register-related macros.

Macros 144 include the macros read from the stored IC definitions 140 and stored board configurations 142 that are associated with the selected IC and interface board. Macros 144 are provided to test sequencer 132 for adapting and configuring the hardcoded test sequence during execution of the test sequence.

Hardware interface 150 represents conventional software that provides an interface between a test program and the communications channel that connects system 122 to an interface board.

While the embodiment of FIG. 2 includes multiple concurrent processes, those skilled in the art will appreciate that in alternative embodiments the functionality described herein could be implemented sequentially or in a distributed manner. In addition, the functionality could be hosted by a variety of classes of computer systems.

In another embodiment, multiple test sequencers could be deployed, whereby multiple ICs can be tested simultaneously.

Figure 3:
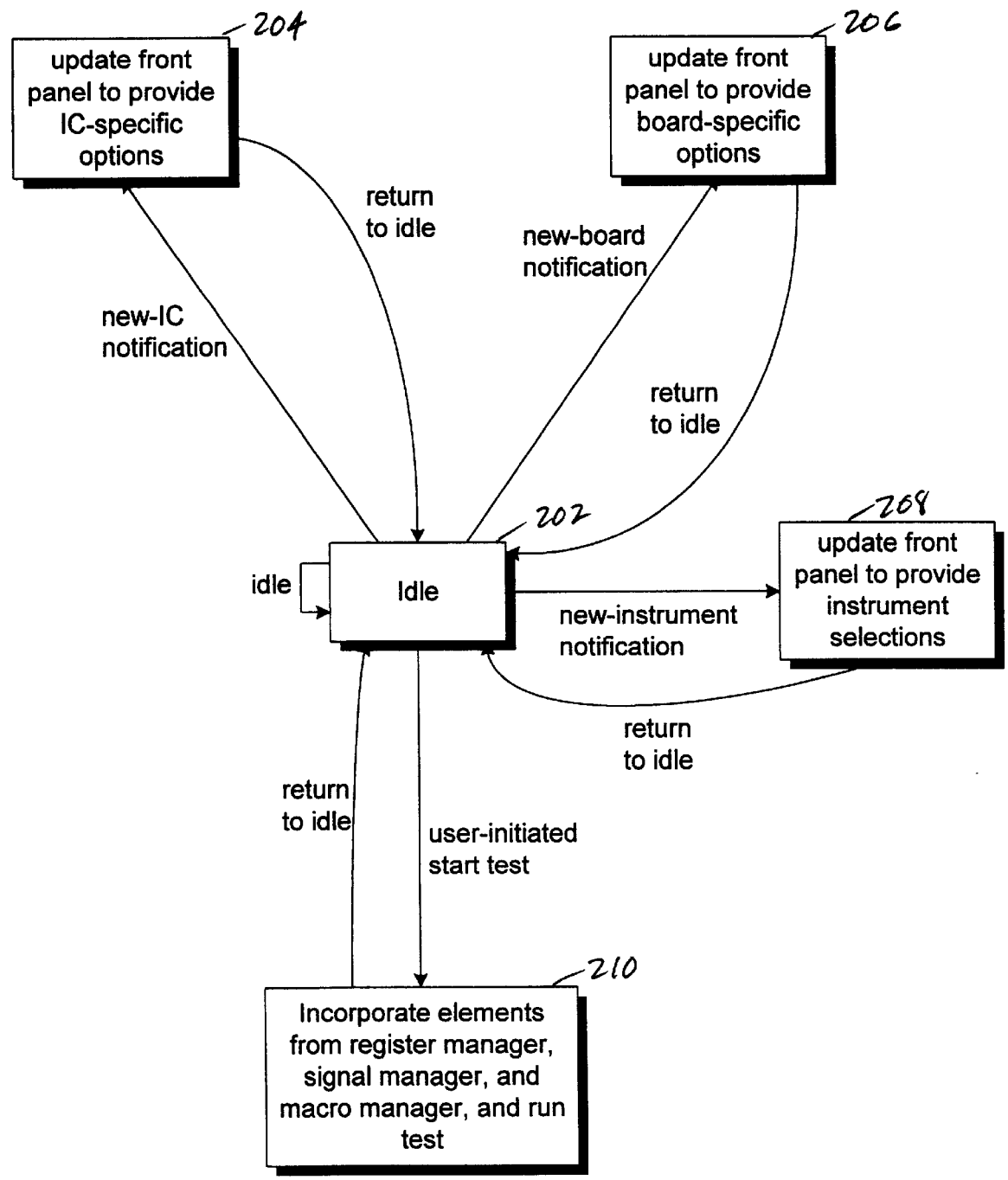
FIG. 3 is a block diagram showing operating characteristics of a test sequencer in accordance with one embodiment.

FIG. 3 is a block diagram showing operating characteristics of test sequencer 132. Test sequencer 132 generally remains in an idle state 202 until an input signal is received from user interface 124 or a notification is received from one of IC selector 126, board selector 128, and test instrument auto-detector 130.

In response to a new-IC notification from IC selector 126, test sequencer 132 transitions to step 204, where the output screen, or "front panel," is updated with IC-specific options that are selectable by the user. For example, the user can select from different IC parameters, such as internal capacitor values, gain settings, etc. After the front panel has been updated, test sequencer returns to idle state 202.

Test sequencer 132 transitions to step 204 in response to a new-board notification from board selector 128. At step 204, test sequencer 132 updates the front panel with board specific options that are selectable by the user. For example, the user can select from different board parameters, such as a certain pin being set to "high" or "low" via computer control. After the front panel has been updated, test sequencer returns to idle state 202.

A new-instrument notification causes test sequencer 132 to transition to step 208. A step 208, test sequencer 132 updates the front panel to indicate which instruments are selectable by the user. After updating the front panel, the test sequencer returns to idle state 202.

Test sequencer 132 transitions to step 210 in response to a user initiating a test sequence. At step 210, the test sequencer incorporates macros 144 (FIG. 2) and configuration information generated by register and signal administration managers 134 and 136 with the hard-coded test sequence for the IC under test. When the test is complete, the test sequencer returns to idle state 202.

Figure 4:
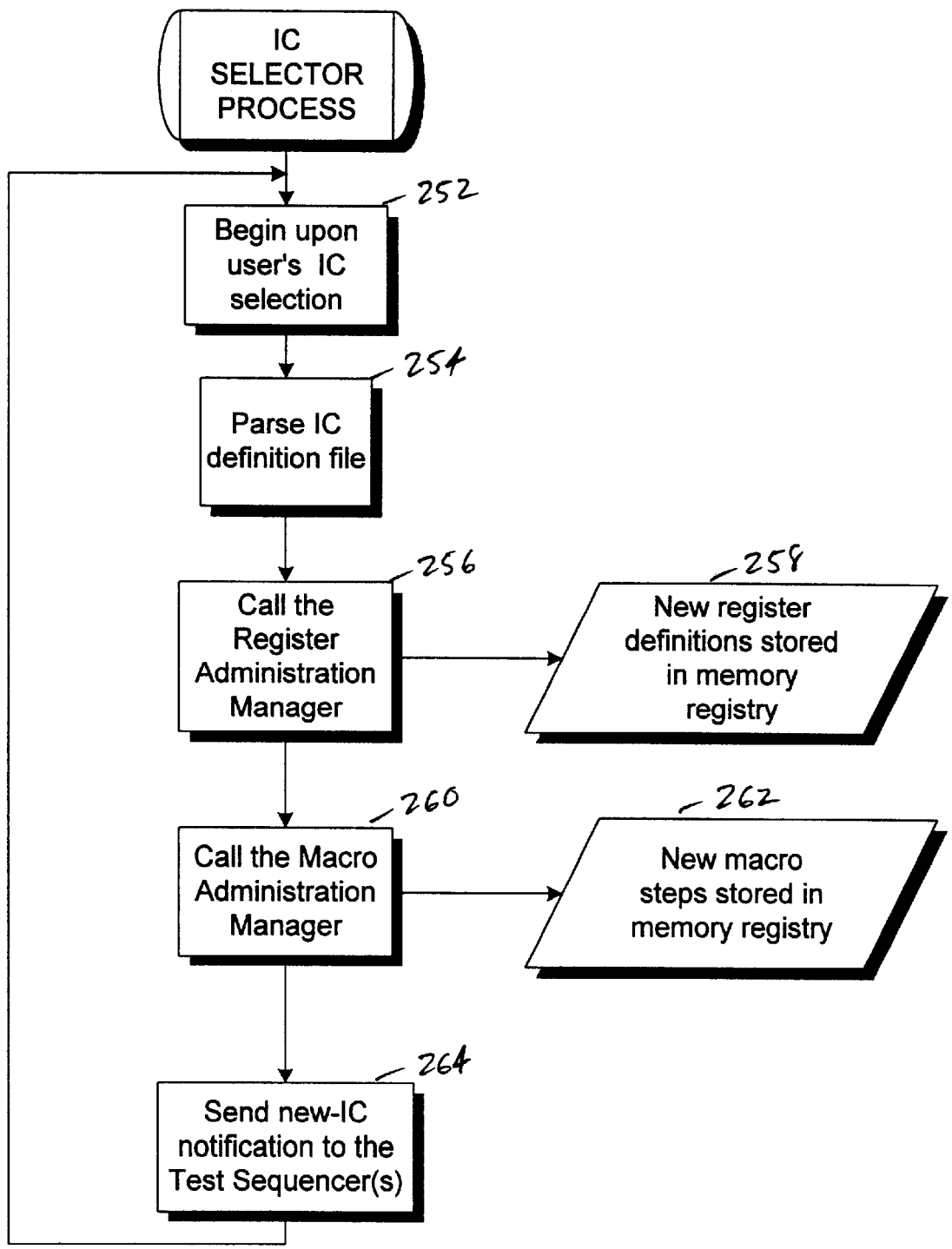
FIG. 4 is a flowchart showing the flow of control for the IC selector process.

FIG. 4 is a flowchart showing the flow of control for IC selector process 126. At step 252, the process commences in response to a user's selection of an IC. The IC definition file associated with the selected IC is parsed at step 254. While not shown, it will be appreciated that syntax errors would cause the IC selector process to abort changing the configuration to the selected IC.

At step 256, the IC selector process calls register administration manager 134, which creates data element 258 including new register definitions that are stored in RAM and accessible to test sequencer 132.

At step 260, the IC selector process calls macro administration manager 138. Macro administration manager creates data element 262, which includes macro steps that are stored in RAM and accessible to test sequencer 132.

Once the new register definitions and new macro steps have been generated, a new-IC notification message is sent to test sequencer 132 at step 264. It will be appreciated that the notification can be provided to a plurality of test sequencers. Multiple test sequencers may be waiting in idle states for the user to start a test sequence. Control is then returned to step 252 to wait for an IC selection.

Figure 5:
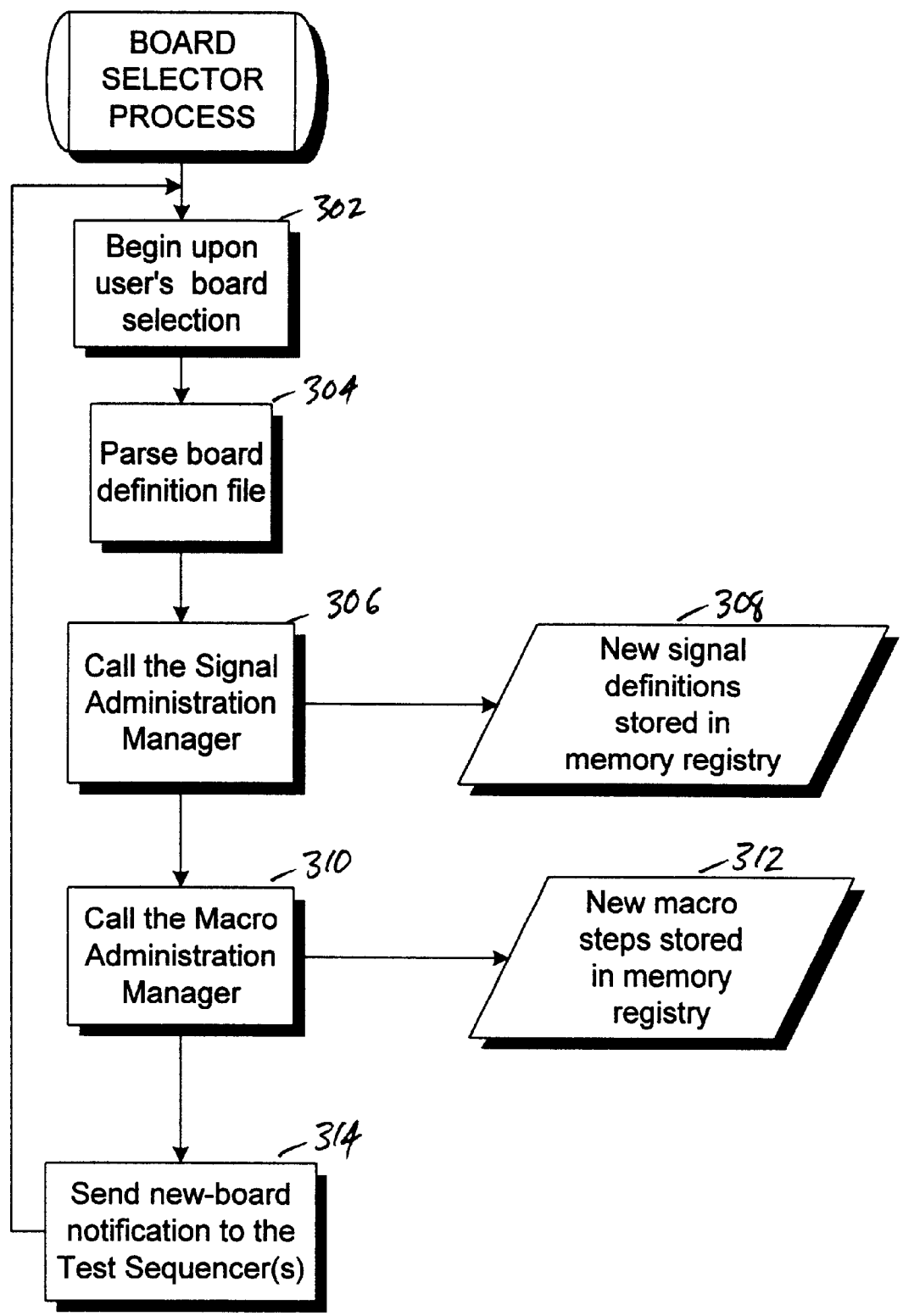
FIG. 5 is a flowchart showing the flow of control for the board selector process.

FIG. 5 is a flowchart showing the flow of control for board selector process 126. At step 302, the process is responsive to a user's selection of an interface board. The board configuration file associated with the selected board is parsed at step 304. While not shown, it will be appreciated that syntax errors would cause the IC selector process to abort changing the configuration to the selected IC.

At step 306, the board selector process calls signal administration manager 136, which creates data element 308 including new signal definitions that are stored in RAM and accessible to test sequencer 132.

At step 310, the board selector process calls macro administration manager 138. Macro administration manager creates data element 262, which includes macro steps that are stored in RAM and accessible to test sequencer 132.

Once the new signal definitions and new macro steps have been generated, a new25 board notification message is sent to test sequencer 132 at step 314. Control is then returned to step 302 to wait for a board selection.

Figure 6:
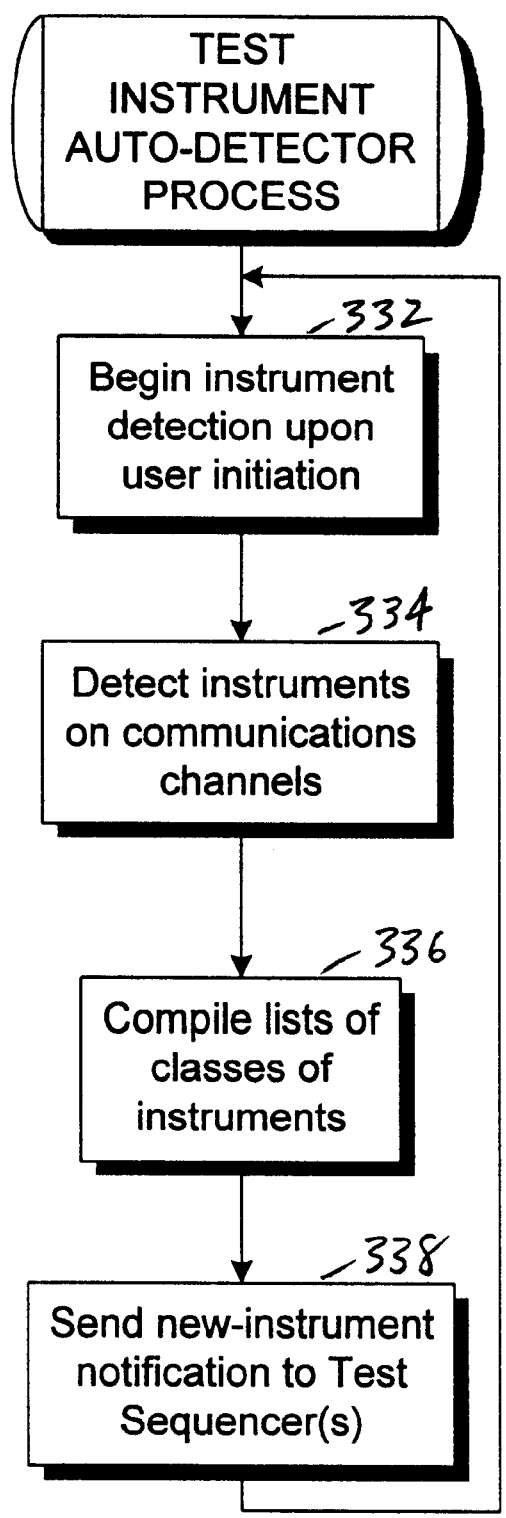
FIG. 6 is a flowchart of the processing performed by the test instrument auto-detector.

FIG. 6 is a flowchart of the processing performed by test instrument auto-detector 130. At step 332, the process is responsive to a user's initiation of the instrument selection function. The instruments that are connected to one or more of the communications channels of the system are detected at step 334. Example instruments include multimeters, oscilloscopes, waveform digitizers, and others known to those skilled in the art. At step 336, a list of the instruments detected is compiled, and at step 338, a new-instrument notification is sent to test sequencer 132. Control is then returned to step 332 to wait for a subsequent request to detect instruments.

FIG. 7 is a flowchart illustrating the processing performed by register administration manager 134 for initializing a test configuration for a different IC. Generally, register administration manager 134 creates a register map for the registers particular to the selected IC, assigns permission codes to the register bits, and determines translation rules for the registers.

At step 402, a register bitmap is created for the selected IC using IC definitions 140. The register map includes the number of registers, the names of registers, hardware addresses, and numbers of bits/register.

At step 404, permission codes are associated with the bits of the IC registers, as represented in the register map. The permission codes are taken from IC definitions 140 and indicate access privileges (e.g., read-only, write-only, read-write) to the bits by the test system.

The translation types of the various parameters are determined and associated with the registers at step 406. At step 408, the register values are read from the IC into system memory in accordance with the program mode. The possible program modes include, for example, a "simulated" mode or a "real chip interface" mode. In simulated mode there is no actual communication with the IC, which is useful, for example, for demonstration purposes. In the "real" mode there is communication between the test system and the IC. After processing is complete, control is returned to IC selector process 126.

FIG. 8 is a flowchart illustrating the processing performed by signal administration manager 136 for initializing a test configuration for a different interface board. Signal administration manager 136 is called by board selector 128 and generally creates a map of signal descriptions for the selected board. At step 422, a signal map is created in system memory that includes the signal names and the number of signals.

At step 424, the signal types and the physical mappings to hardware locations are determined from the board configuration file. The signal types and mappings are then associated with the respective signals in the signal map.

The current signal values are read at step 426 and associated with the various signals in the signal map, when the signals are controllable by the test system. After processing is complete, control is returned to board selector process 128.

FIG. 9 is a flowchart illustrating the initialization processing performed by macro administration manager 138. Macro administration manager 138 creates a new set of macros in system memory based on IC definitions of the selected IC and board configurations of the selected board. At step 444, the macros taken from IC definitions 140 and placed in the new macro set are expanded into component steps.

A macro can incorporate steps from a previously defined macro. A macro usually includes more than one step, for example, setting a register or signal value and displaying a dialog box instructing the user to perform a certain action. A macro expansion consists of decomposing the macro into the constituent steps and storing the steps in a computer memory.

At step 446, the macros taken from board configurations 142 and placed in the new macro set are expanded into component steps. The expansion of board configuration macros is accomplished in a manner similar to the way in which IC macros are expanded.

An executing test program is programmed to call a predetermined macro by name. The named macro references the constituent steps of the macro as generated by macro administration manager 138. Thus, the named macro points to a set of steps in macros 144.

Control is returned to the calling process (either IC selector 126 or board selector 128) after the macros have been expanded.

Accordingly, the present invention provides, among other aspects, a method and apparatus for testing ICs. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A computer-implemented method for programmed interaction with integrated circuits, comprising:

loading a predetermined program sequence suitable for a plurality of integrated circuits having common characteristics and for a plurality of interface boards having common characteristics;

responsive to a first selection signal, obtaining register characteristics and one or more program operations particular to one of the plurality of integrated circuits; and adapting the predetermined program sequence applied to the one of the plurality of integrated circuits using the register characteristics and the one or more program operations, wherein the program operations particular to the one of the integrated circuits and to one of the interface boards include operations on one or more registers of the integrated circuit and operations on one or more signals of the interface board.

2. A computer-implemented method for programmed interaction with integrated circuits, comprising:

loading a predetermined program sequence suitable for a plurality of integrated circuits having common characteristics and for a plurality of interface boards having common characteristics;

responsive to a first selection signal, obtaining register characteristics and one or more program operations particular to one of the plurality of integrated circuits; and adapting the predetermined program sequence applied to the one of the plurality of integrated circuits using the register characteristics and the one or more program operations;

responsive to a second selection signal, obtaining signal characteristics and one or more board interface program operations particular to one of the plurality of interface boards; and adapting the predetermined program sequence applied to the one of the plurality of integrated circuits via the one of the plurality of interface boards using the signal characteristics and the one or more board interface program operations; wherein the program operations are particular to the one of the integrated circuits, and the program operations particular to the one of the interface boards include operations on one or more registers of the integrated circuit and operations on one or more signals of the interface board.

3. The method of claim 1, wherein a computer is coupled to the selected integrated circuit and further comprising automatically detecting electrical measurement instruments coupled to the computer in response to a detect-instrument signal.

4. The method of claim 1, wherein a computer is coupled to the selected integrated circuit and further comprising:

creating a register map in memory of the computer based on the register characteristics;

storing the program operations in the memory of the computer.

5. The method of claim 4, wherein the register map includes a total number of registers in the integrated circuit, names of registers, addresses of the registers, and respective total numbers of bits/register.

6. A computer-implemented method for programmed interaction with integrated circuits, comprising:

loading a predetermined program sequence suitable for a plurality of integrated circuits having common characteristics;

responsive to a first selection signal, obtaining register characteristics and one or more program operations particular to one of the plurality of integrated circuits;

adapting the predetermined program sequence applied to the one of the plurality of integrated circuits using the register characteristics and the one or more program operations, wherein a computer is coupled to the selected integrated circuit;

creating a register map in memory of the computer based on the register characteristics; and storing the program operations in the memory of the computer, wherein the register map includes a total number of registers in the integrated circuit, names of registers, addresses of the registers, and respective total numbers of bits/register, and wherein the register map further includes permission codes respectively associated with bits of the registers.

7. A computer-implemented method for programmed interaction with integrated circuits, comprising:

loading a predetermined program sequence suitable for a plurality of integrated circuits having common characteristics;

responsive to a first selection signal, obtaining register characteristics and one or more program operations particular to one of the plurality of integrated circuits;

adapting the predetermined program sequence applied to the one of the plurality of integrated circuits using the register characteristics and the one or more program operations, wherein a computer is coupled to the selected integrated circuit;

creating a register map in memory of the computer based on the register characteristics; and storing the program operations in the memory of the computer, wherein the register map includes a total number of registers in the integrated circuit, names of registers, addresses of the registers, and respective total numbers of bits/register, and wherein the register map further includes translation codes that respectively map bit values in the registers to alternative forms of data.

8. The method of claim 2, wherein a computer is coupled to the selected interface board and further comprising:

creating a signal map in memory of the computer based on the characteristics of the interface board; and storing the interface board program operations in the memory of the computer.

9. A computer-implemented method for programmed interaction with integrated circuits, comprising:

loading a predetermined program sequence suitable for a plurality of integrated circuits having common characteristics;

responsive to a first selection signal, obtaining register characteristics and one or more program operations particular to one of the plurality of integrated circuits;

adapting the predetermined program sequence applied to the one of the plurality of integrated circuits using the register characteristics and the one or more program operations, wherein a computer is coupled to the selected integrated circuit;

creating a register map in memory of the computer based on the register characteristics; and storing the program operations in the memory of the computer, wherein the predetermined program sequence is suitable for an interface board, and wherein the selected interface board includes physical ports and the signal map includes mappings of signal names to the physical ports of the interface board.

10. The method of claim 9, wherein the signal map further includes signal types respectively associated with the signals.

11. The method of claim 10, wherein the signal types include analog and digital.

12. A system for computer programmed interaction with integrated circuits, comprising:

means for loading a predetermined program sequence suitable for a plurality of integrated circuits having common characteristics and for a plurality of interface boards having common characteristics;

means responsive to a first selection signal, for obtaining register characteristics and one or more program operations particular to one of the plurality of integrated circuits; and means for adapting the predetermined program sequence applied to the one of the plurality of integrated circuits using the register characteristics and the one or more program operations, wherein the program operations particular to the one of the integrated circuits and to one of the interface boards include operations on one or more registers of the integrated circuit and operations on one or more signals of the interface board.

13. The system of claim 12, further comprising:

means responsive to a second selection signal, for obtaining signal characteristics and one or more board interface program operations particular to one of the plurality of interface boards; and means for adapting the predetermined program sequence applied to the one of the plurality of integrated circuits via the one of the plurality of interface boards using the signal characteristics and the one or more board interface program operations.

14. A system for computer programmed interaction with integrated circuits, comprising:

a programmable processor;

a storage element having a predetermined program sequence suitable for a plurality of integrated circuits having common characteristics and for a plurality of interface boards having common characteristics;

a program adapted for execution by the processor to cause the processor to, responsive to a first selection signal, obtain register characteristics and one or more program operations particular to one of the plurality of integrated circuits, a id adapt the predetermined program sequence applied to the one of the plurality of integrated circuits using the register characteristics and the one or more program operations;

wherein the program operations particular to the one of the integrated circuits and to one of the interface boards include operations on one or more registers of the integrated circuit and operations on one or more signals of the interface board.

15. The system of claim 14, wherein the predetermined program sequence is suitable for a plurality of interface boards having common characteristics, and the program is further adapted to:

responsive to a second selection signal, obtain signal characteristics and one or more board interface program operations particular to one of the plurality of interface boards; and adapt the predetermined program sequence applied to the one of the plurality of integrated circuits via the one of the plurality of interface boards using the signal characteristics and the one or more board interface program operations.

16. The system of claim 14 wherein the program is further adapted to detect measurement instruments coupled to the processor in response to a detect-instrument signal.

17. The system of claim 14 further comprising a memory coupled to the processor, wherein the program is further adapted to:

create a register map in the memory based on the register characteristics; and store the program operations in the memory.

18. The system of claim 17, wherein the register map includes a total number of registers in the integrated circuit, names of registers, addresses of the registers, and respective total numbers of bits/register.

19. The system of claim 18, wherein the register map further includes permission codes respectively associated with bits of the registers.

20. The system of claim 18, wherein the register map further includes translation codes that respectively map bit values in the registers to alternative forms of data.

21. A system for computer programmed interaction with integrated circuits, comprising:

a programmable processor;

a storage element having a predetermined program sequence suitable for a plurality of integrated circuits having common characteristics and suitable for a plurality of interface boards having common characteristics;

a program adapted for execution by the processor to cause the processor to, responsive to a first selection signal, obtain register characteristics and one or more program operations particular to one of the plurality of integrated circuits, adapt the predetermined program sequence applied to the one of the plurality of integrated circuits using the register characteristics and the one or more program operations, responsive to a second selection signal, obtain signal characteristics and one or more board interface program operations particular to one of the plurality of interface boards, and adapt the predetermined program sequence applied to the one of the plurality of integrated circuits via the one of the plurality of interface boards using the signal characteristics and the one or more board interface program operations; and a memory coupled to the processor, wherein the program is adapted to:

create a signal map in the memory based on the characteristics of the interface board; and store the interface board program operations in the memory.

22. A system for computer programmed interaction with integrated circuits, comprising:

a programmable processor;

a storage element having a predetermined program sequence suitable for a plurality of integrated circuits having common characteristics;

a program adapted for execution by the processor to cause the processor to, responsive to a first selection signal, obtain register characteristics and one or more program operations particular to one of the plurality of integrated circuits, and adapt the predetermined program sequence applied to the one of the plurality of integrated circuits using the register characteristics and the one or more program operations; and a memory coupled to the processor, wherein the program is further adapted to create a register map in the memory based on the register characteristics, and to store the program operations in the memory, wherein the selected interface board includes physical ports and the signal map includes mappings of signal names to the physical ports of the interface board.

23. The system of claim 22, wherein the signal map further includes signal types respectively associated with the signals.

24. The system of claim 23, herein the signal types include analog and digital.

25. A system for computer programmed interaction with integrated circuits, comprising:

a programmable processor;

a storage element having a predetermined program sequence suitable for a plurality of integrated circuits having common characteristics and suitable for a plurality of interface boards having common characteristics;

a program adapted for execution by the processor to cause the processor to, responsive to a first selection signal, obtain register characteristics and one or more program operations particular to one of the plurality of integrated circuits, adapt the predetermined program sequence applied to the one of the plurality of integrated circuits using the register characteristics and the one or more program operations, responsive to a second selection signal obtain signal characteristics and one or more board interface program operations particular to one of the plurality of interface boards, and adapt the predetermined program sequence applied to the one of the plurality of integrated circuits via the one of the plurality of interface boards using the signal characteristics and the one or more board interface program operations, wherein the program operations are particular to the one of the integrated circuits, and the program operations particular to the one of the interface boards include operations on one or more registers of the integrated circuit and operations on one or more signals of the interface board.

* * * * *